(12) United States Patent
Kishimura

(10) Patent No.: US 6,646,751 B2
(45) Date of Patent: Nov. 11, 2003

(54) APPARATUS AND METHOD FOR MEASURING TRENCH DEPTH

(75) Inventor: Michifumi Kishimura, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 462 days.

(21) Appl. No.: 09/766,002

(22) Filed: Jan. 19, 2001

(65) Prior Publication Data

US 2002/0097405 A1 Jul. 25, 2002

(30) Foreign Application Priority Data

Jan. 20, 2000 (JP) .................................... 2000-011298

(51) Int. Cl.[7] .............................................. G01B 11/22
(52) U.S. Cl. ...................................... 356/626; 356/241.1
(58) Field of Search .............................. 356/241.1, 626, 356/243.1

(56) References Cited

U.S. PATENT DOCUMENTS 5,392,118 A    2/1995   Wickramasinghe 6,486,965 B1 * 11/2002 Kim ............................ 356/626

FOREIGN PATENT DOCUMENTS

| JP | 61-99806  | 5/1986 |
| JP | 11-45679  | 2/1999 |

* cited by examiner

Primary Examiner—Richard A. Rosenberger
(74) Attorney, Agent, or Firm—Katten Muchin Zavis Rosenman

(57) ABSTRACT

A method for measuring the depth of a subject trench includes the steps of forming on a substrate a plurality of measurement trenches having different widths $a_j$ ($a_i < a_{j+1}$, $i = 1, 2, \ldots, n$) and a depth equal to the depth $d_0$ of the subject trench, irradiating the measurement trenches with a parallel ray at an incidence angle of $\theta$ with respect to the substrate surface while detecting the reflected ray from the substrate, separating the measurement trenches into a first group providing dark images and a second group providing bright images, and calculating a range for the depth $d_0$ by using a largest width $a_k$ of the measurement trenches in the first group and a smallest width $a_{k+1}$ of the measurement trenches in the second group based on the following relationship:

$$(a_k/2)\tan\theta < d_0 \leq (a_{k+1}/2)\tan\theta.$$

8 Claims, 6 Drawing Sheets

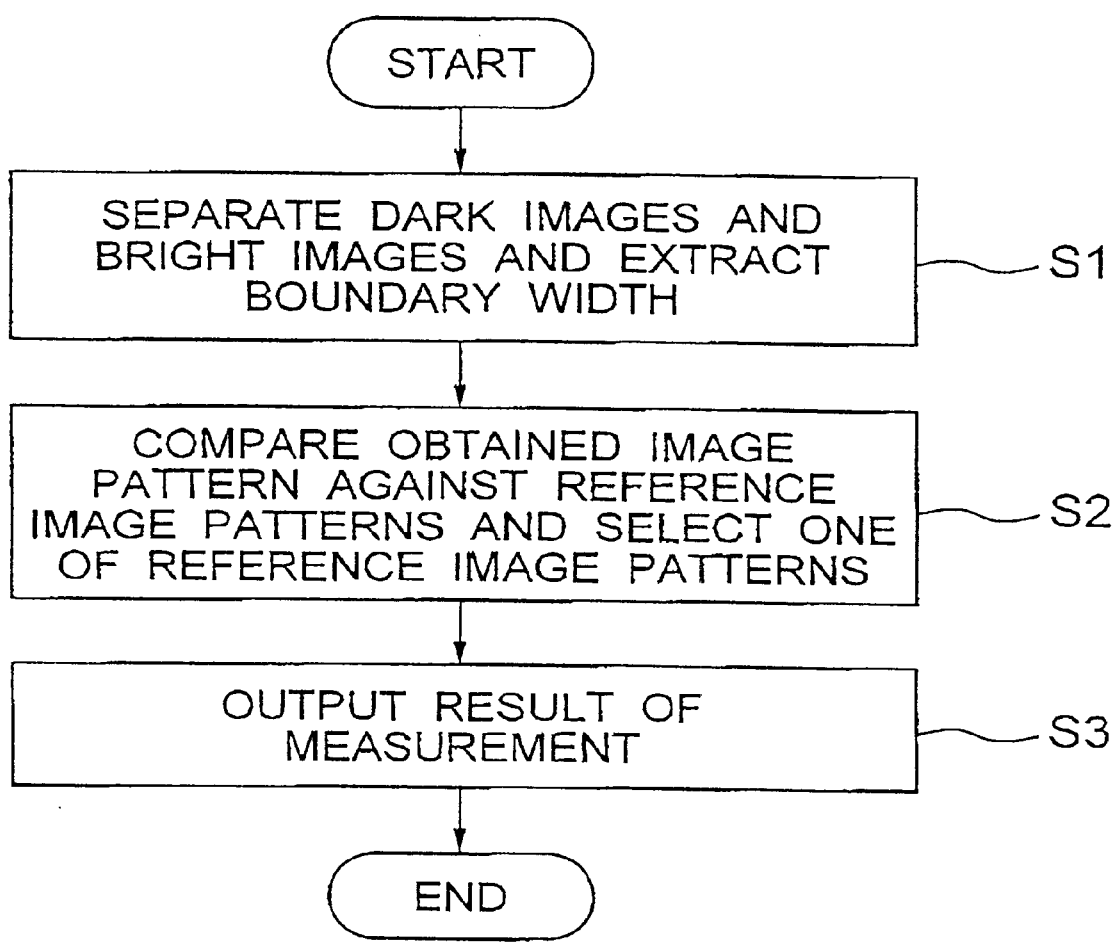

APPARATUS AND METHOD FOR MEASURING TRENCH DEPTH

BACKGROUND OF THE INVENTION (a) Field of the Invention

The present invention relates to an apparatus for measuring a trench depth and, more particularly, to an apparatus for measuring the depth of a trench, groove or hole (collectively referred to as "trench" in this text) formed on a semiconductor wafer etc. The present invention also relates to a method for measuring the depth of such a trench.

(b) Description of the Related Art

Along with development of higher integration of semiconductor devices, a three-dimensional structure is now employed for arranging semiconductor elements, in addition to the conventional two-dimensional structure. In the three-dimensional structure, as well as a two-dimensional structure, a trench is generally formed for electrically isolating adjacent semiconductor elements. Since the depth of the trench significantly affects the device characteristics of the semiconductor elements, it is desired to measure the depth of the trench thus formed or examine whether or not the trench has a design depth.

A technique using an optical interference or optical diffraction has been generally used for measuring the depth of a fine trench in a semiconductor device. However, a measuring apparatus using such a technique has a complicated structure and thus is expensive. In addition, such a measuring apparatus is not suited for measuring the depth at a high speed FIG. 1 shows a conventional apparatus for measuring the depth of a trench, described in Patent Publication JP-A-61-099806. Laser beam 111 emitted from a laser source 11 is focused by a lens 12 to be incident onto an end of an optical fiber 13. The laser transmitted by the optical fiber 13 is received by an optical head 14, which collimates the laser beam to form a parallel ray 112. The parallel ray 112 is incident onto the sample 17 having a subject trench 10 to be measured for the depth thereof.

The optical head 14 then receives the laser reflect from the sample 17, and reflects the received laser by a semitransparent mirror prism in the optical head 14 to be incident onto an optical sensor 18. The optical sensor 18 converts the laser to an electric signal, witch is measured by a volt meter 19 to detect the intensity of the reflected laser. A power supply source 20 supplies power to the optical sensor 18.

A slider 21 attached onto the optical head 14 is moved along an arched arm 22 having a scale thereon for changing the incidence angle of the laser 112 while observing the indication of the volt meter 19. The depth of the trench 10 can be measured from the incidence angle $\theta_R$ at which the reading of the volt meter 19 assumes a minimum. The depth (d) is obtained from the following equation:

$$\theta_r = \tan{-1}(a/d)$$

wherein "a" is the width of the trench.

In the technique as described above, it also takes a long time to measure the depth of the trench and not suited for measuring the depth of a subject trench at a high speed.

SUMMARY OF THE INVENTION

In view of the above problems in the conventional techniques, it is an object of the present invention to provide an apparatus and a method for measuring the depth of a subject trench at a higher speed with a simple structure of the apparatus.

The method of the present invention for measuring the depth of a subject trench, in one embodiment thereof, includes the steps of forming, on a substrate, a plurality of measurement trenches having different widths $a_i$ ($a_i < a_{i+1}$, i=1, 2, ..., n) and a depth equal to the depth $d_0$ of the subject trench, irradiating the measurement trenches with a parallel ray at an incidence angle of $\theta$ with respect to the surface of the substrate at the location of the trenches and detecting the reflected ray from tie substrate, separating the measurement into a first group of trenches providing dark images and a second group of trenches providing bright images, and calculating the range for the depth $d_0$ by using the largest width $a_k$ of the trenches in the first group and the smallest width $a_{k+1}$ of the trenches in the second group based on the following relationship:

$$(a_k/2)\tan\theta < d_0 \leq (a_{k+1}/2)\tan\theta.$$

By setting the incidence angle $\theta$ of the parallel ray with respect to the substrate surface at 45 degrees in the above method, calculation can be simplified due to the fact that $\tan\theta=1$. This further reduces the time length for the measurement. In addition, by determining the term $\{(a_{i+1}-a_i)/2\}\tan\theta$ below an allowable error for the depth, the accuracy of measurement based on the above relationship can be improved The method of the present invention, in another embodiment thereof, includes the steps of preparing a plurality (M) of reference image patterns each formed from a plurality (N) of reference trenches having different widths of $a_j$ ($a_j < a_{j+1}$, j=1, 2, ... N) and a common depth selected from M different depths of $d_h$ ($d_h < d_{h+1}$, h=1, 2, ... M, and M≠N or M=N) by using a parallel ray irradiated at an incidence angle of $\theta$ with respect to the surface of a reference substrate having the reference trenches, forming, on a measurement substrate, a plurality of measurement trenches having different widths $a_i$, ($a_i < a_{i+1}$, i=1, 2, ..., n) and a depth equal to the depth $d_0$ of the subject trench, irradiating a parallel ray at an incidence angel of $\theta$ with respect to the surface of the measurement substrate and detecting the reflected ray from the measurement substrate, detected a boundary width (or critical width) between the widths of a first group of trenches providing dark images and the width of a second group of trenches providing bright images, and selecting, for the depth $d_0$, the depth of the plurality of reference trenches which provide one of the reference image patterns having a boundary width corresponding to the boundary width detected from the measurement trenches. The depths $d_h$ of the reference trenches are measured beforehand by using a known technique.

The apparatus of the present invention for measuring the depth of a subject trench, in one embodiment thereof, includes a device for forming on a substrate a plurality of measurement trenches having a depth equal to the depth of the subject trench, a light source for irradiating light to the substrate at an incidence angle of $\theta$ with respect to the substrate surface, a CCD camera for detecting the images of the trenches in the reflected light from the substrate to output a image signal, and a processing unit for calculating the depth $d_0$ of the subject trench based on the image signal from the CCD camera, by separating the measurement trenches into a first group of trenches providing dark images and a second group of trenches providing bright images, and calculating the range for the depth $d_0$ by using largest width $a_k$ of the trenches in the first group and the smallest width $a_{k+1}$ of the trenches in the second group based on the follow relationship:

$$(a_k/2)\tan\theta < d_0 \leq (a_{k+1}/2)\tan\theta.$$

The apparatus of the present invention for measuring the depth of a subject trench, in another embodiment of includes a storage device for storing a plurality (M) of reference images patterns each formed from a plurality (N) of reference trenches having different widths of $a_j$ ($a_j < a_{j+1}$, j=1, 2, ... N) and a common depth selected from M different depths of $d_h$ ($d_h < d_{h+1}$, h=1, 2, ... M, and M≠N or M=N), a device for forming on a substrate a plurality of measurement trenches having a depth equal to the depth of the subject trench a light source for irradiating light to the substrate at an incidence angel of $\theta$ with respect to the substrate surface, a CCD camera for detecting the images of the trenches the reflected light from the substrate to output an image signal, and a processing unit for calculating the depth do of the subject trench based on the image signal from the CCD camera by detecting a boundary width between the widths of a first group of trenches providing dark images and the width of a second group of trenches providing bright and selecting, for the depth $d_0$, the depth of the plurality of reference trenches which provide one of the reference image patterns having a boundary width corresponding to the boundary width detected from the measurement trenches.

In accordance with the present invention, the depth of the subject trench can be measured by using a parallel ray in a smaller time length with a simple structure of the apparatus without using a optical interference or optical diffraction.

The above and other objects, features and advantages of the present invention will be more apparent from the following description, referring to the accompanying drawings.

BRIEF DESCRIPTION OF THE DRAWINGS

FIG. 7 is a flowchart of the operation by an apparatus according to another embodiment of the present invention.

PREFERRED EMBODIMENTS OF THE INVENTION

Before describing preferred embodiments of the present invention, the principle of the present invention is described.

Figure 1:
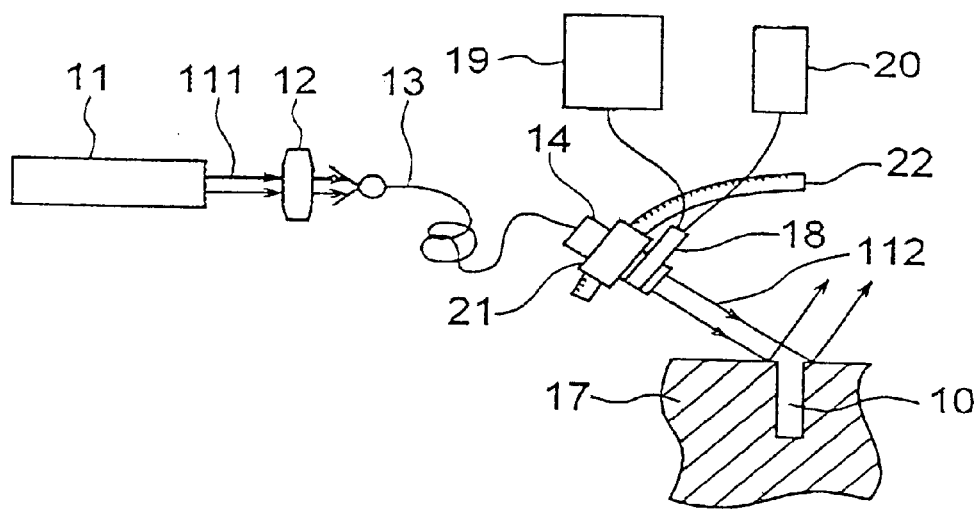
FIG. 1 is a schematic side view of a conventional apparatus for measuring the depth of a trench.
Figure 2A:
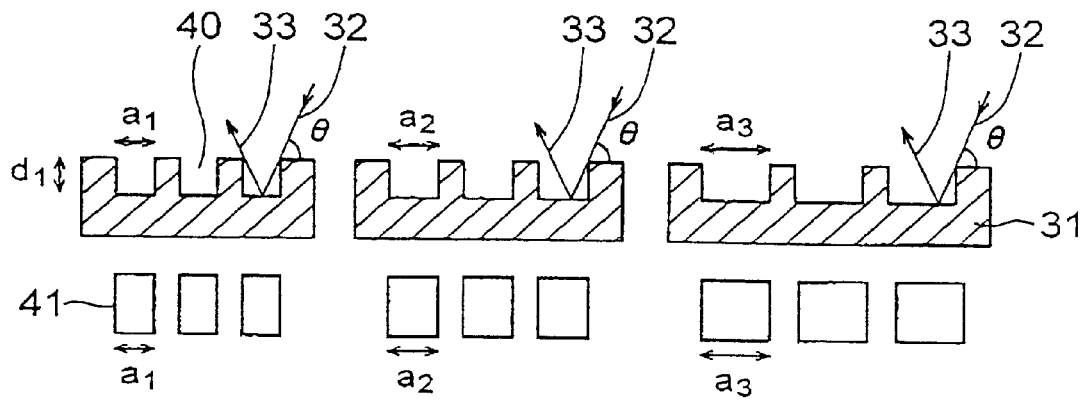
FIGS. 2A 2B and 2C are schematic diagrams each showing the principle of the present invention by illustrating sectional views of a plurality of trenches having different widths and depths and corresponding optical images obtained therefrom.
Figure 2B:
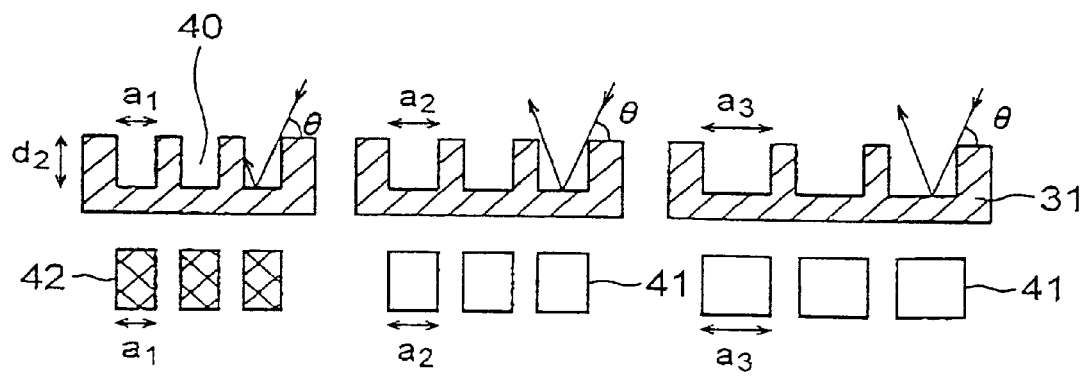
Figure 2C:
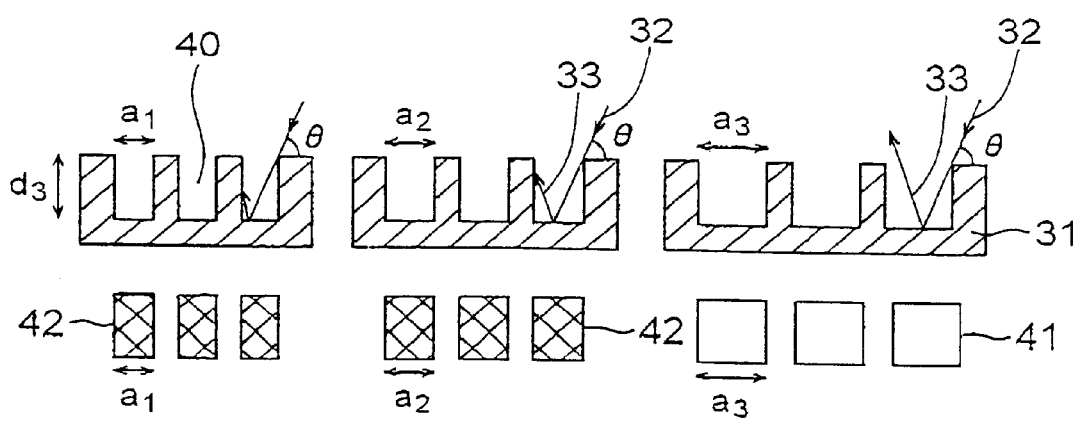

Referring to FIGS. 2A, 2B and 2C there are shown different cases of dark images and bright images being obtained from trenches based on the reflected light depending on the depths and widths of the trenches. These figures in fact show an example of reference trenches and reference obtained therefrom.

In each of FIGS. 2A, 2B and 2C, a plurality of trenches 40 having specified widths $a_1$, $a_2$ and $a_3$ ($a_1 < a_2 < a_3$) and a depth $d_1$, $d_2$ or $d_3$, ($d_1 < d_2 < d_3$) are formed and arranged in the ascending order of the widths for each of the depths on a single substrate 31. A parallel ray 32 is incident onto the substrate 31 including the trenches 40 at an incidence angle of $\theta$ (acute angel) with respect to the substrate surface. The reflected ray 33 from the substrate 31 is observed and the observed images 41 and 42 are shown below the respective trenches 40. If the light reflected from the bottom of a trench is blocked by the wall of the same trench due to a larger depth or smaller width, the resultant image is dark. On the other hand, if the light reflected from the bottom is detected by the optical sensor without blockage by the wall due to a smaller depth or larger width, the resultant image is bright.

In FIG. 2A where trenches 40 having a small depth $d_1$ are formed on the substrate 31, the observed images include only bright images 41 irrespective of the widths $a_1$, $a_2$ and $a_3$ of the trenches 40. In FIG 2B wherein trenches 40 having a medium depth $d_2$ are formed on the substrate 31, the observed images include dark images 42 for the trenches having a smaller width $a_1$, and bright images 41 for the trenches having medium and larger widths $a_2$ and $a_3$. In FIG. 3A wherein trenches 40 having a larger depth $d_3$ are formed on the substrate 31, the observed images include dark images 42 for the trenches having smaller and medium widths $a_1$, and $a_2$ and bright images 41 for the trenches having larger width $a_3$.

It will be understood from the above description that the brightness or darkness of the observed images depends on the depth and the width of the trench, provided that the includes angle of the parallel ray is fixed. Thus, by detecting the boundary width (or critical width) between the widths of the first group of trenches providing dark images and the widths of the second group of trenches providing bright images, the depth of the trenches can be calculated based on the relationship between the depth $d_0$ and the widths $a_k$ and $a_{k+1}$ which are adjacent to the boundary width in both the groups, i.e., the largest width $a_k$ in the first group and the smallest width $a_{k+1}$ in the second group.

In FIGS. 2A, B and 2C, the trench widths $a_i$ (i=1, 2, 3) and the trench depths $d_h$ (h=1, 2, 3) have relationships as follows:

$$d_1 \leq (a_1/2)\tan\theta;$$

$$(a_1/2)\tan\theta < d_2 \leq (a_a/2)\tan\theta;$$

and $$(a_2/2)\tan\theta < d_3 \leq (a_3/2)\tan\theta.$$

In FIG. 2A wherein trenches 40 have a depth of $d_1$, all the observed images are bright, whereby the depth cannot be determined. In FIG. 2B wherein the trenches have a depth of $d_2$, the trenches having a width of $a_1$ provides dark images whereas in FIG. 2C wherein the trenches have a depth of $d_3$, the trenches having a width of $a_1$, or $a_2$ provides dark images, Thus, if a plurality of measurement trenches are formed as shown in FIGS. 2B and 2C, the observed images can be used for detecting the boundary width between the widths of the trenches in the group providing dark images and the widths of the trenches in the group providing a bright image.

The largest width $a_k$ in the first group providing the dark images and the smallest width $a_{k+1}$ in the second group providing the bright images are used for detecting the range of the depth of the subject trenches by the following relationship:

$$(a_k/2)\tan\theta < d \leq (a_{k+1}/2)\tan\theta. \quad (1)$$

By using a wide variety of the trench widths $a_1, a_2, \ldots a_n$, a wide range of trench depths can be measured in the present invention. By employing a smaller value for the step difference $\Delta a_i (\Delta a_i = a_{i+1} - a_i)$, an accurate depth can be detected.

Assuming that the allowable error for the trench depth $d_0$ (true value) is $\alpha$, if the following relationship:

$$d - \alpha \leq d_0 \leq d + \alpha \quad (2)$$

is satisfied for the measured depth d, then the depth $d_0$ can be represented by d.

Thus, by comparing the relationships (1) and (2), if the following relationships:

$$d + \alpha = (a_{k+1}/2)\tan\theta \quad (3)$$

$$d - \alpha = (a_k/2)\tan\theta \quad (4)$$

are satisfied, the trench depth $d_0$ can be represented by d. From above equations (3) and (4), $$\alpha = \{(a_{k+1} - a_k)/4\}\tan\theta \quad (5)$$

$$d = \{(a_{k+1} + a_k)/4\}\tan\theta \quad (6)$$

can be obtained. Thus, by determining the step difference $\Delta a_i(\Delta a_i = a_{k+1} - a_k)$ so that the value for $\{(a_{k+1} - a_k)/4\}\tan\theta$ is below the allowable error $\alpha$, the trench depth can be represented by the value "d" expressed by the equation (1) within the allowable error, although some uncertainty remains for the depth in the range between $(a_k/2)\tan\theta$. For specifying the value for the depth, the trench depth $d_0$ may be represented by $(a_{k+1}/2)\tan\theta$, for example, which corresponds to the upper limit $(d+\alpha)$ of the trench depth.

It is preferable that reference image patterns be prepared beforehand each from a plurality of reference trenches having different widths $a_i$ ($a_i < a_{i=1}$, i=1, 2, ... n) and a common depth selected from a plurality of different reference depths $d_h$. Each of the reference patterns is prepared by irradiating the reference substrate with a parallel ray, the reference substrate including thereon the plurality reference trenches having the common depth. The plurality of reference image patterns are stored in a storage device.

A plurality of measurement trenches having different widths $a_i$ and a depth equal to the depth of the subject trench are formed and irradiated by a parallel ray at an incidence angle equal to the incidence angle of the parallel ray used for obtaining the reference image patterns. By comparing the obtained image pattern against each of the reference image patterns, one of the reference image patterns having a boundary width corresponding to the boundary width of the obtained image pattern is selected. The depth of the subject trench is determined from the depth of the reference trenches providing the selected reference image pattern.

For example, by using the reference trenches such as shown in FIGS. 2A, 2B and 2C, the associated images are stored as the reference image patterns. If the images of the measurement trenches having a depth equal to the depth of the subject trench exhibit a boundary width which resides between $a_1$ and $a_2$, the depth of the subject trench is determined as the reference depth $d_2$ because the obtained boundary width corresponds to the boundary width in the reference image pattern shown in FIG. 2B. The depth of the reference trenches are measured beforehand by a known method.

Now, the present invention is more specifically described with reference to preferred embodiments thereof.

Figure 3:
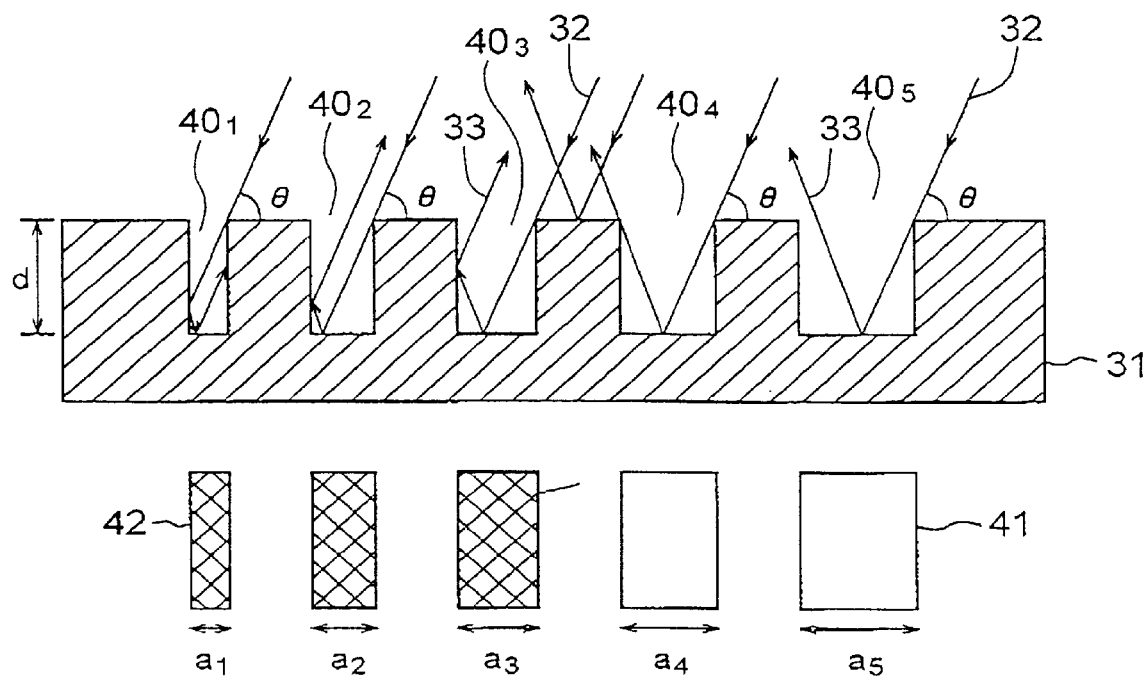
FIG. 3 is an enlarged schematic diagram showing a sectional view of a plurality of trenches and corresponding optical images obtained therefrom by a method according to an embodiment of the present invention.
Figure 4:
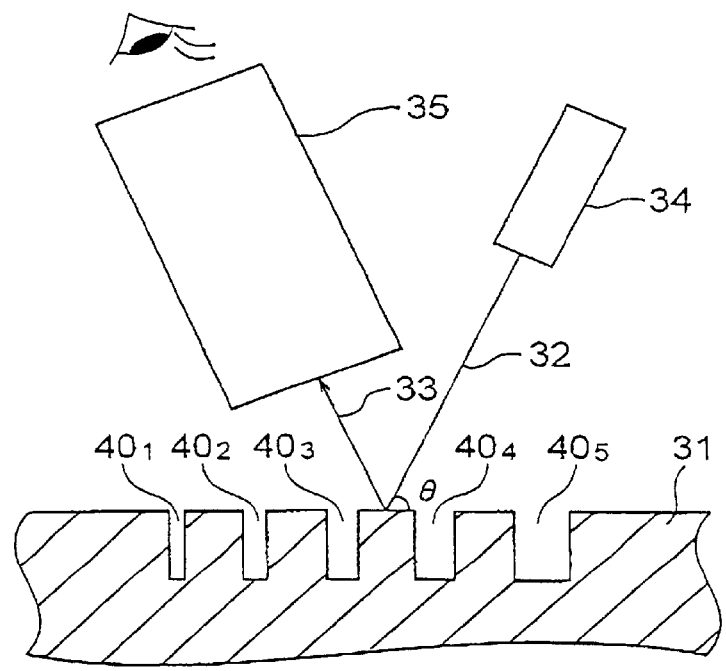
FIG. 4 is a side view of an optical system of an apparatus used for measuring the depth of a trench according to the embodiment

Referring to FIG. 3, a plurality of trenches (measurement trenches) $40_1$ to $40_5$ are formed on a substrate 31 when a subject trench (not shown) is formed on the same substrate 31. These trenches $40_1$ to $40_5$ have different widths $a_1$ to $a_5$ ($a_i < a_{i+1}$, $\Delta a_i = a_{i+1} - a_i$ is constant, and i=1, 2, ... 5), and a common depth equal to the depth of the subject trench. The measurement trenches $40_1$ to $40_5$ are arranged in the ascending order for the width in a marginal area of a wafer, such as a scribe area at which the wafer is to be separated, or a test pattern area which does not affect the operation of the product semiconductor device. As shown in FIG. 4, a parallel ray 32 is incident from a light source 34 onto the substrate 31 at an incidence angle of $\theta$ with respect to the surface of the substrate 31, and the reflected ray 33 from the substrate 31 is observed by using an optical system 35.

By observing the reflected ray 33, the image for each of the trenches is judged as a bright image or a dark image. After determining the group of dark images and the group of bright images, as shown in the example of FIG. 3, it is judged that the boundary width resides between $a_3$ and $a_4$.

As understood from FIG. 3, the dark image corresponds to the relationship:

$$d > (a/2)\tan\theta$$

whereas the bright image corresponds to the relationship:

$$d \leq (a/2)\tan\theta.$$

Thus, the depth $d_0$ of the subject trench or the measurement trenches is obtained from the following relationship:

$$(a_3/2)\tan\theta < d_0 \leq (a_4/2)\tan\theta.$$

Since the incidence angle $\theta$ and the widths $a_1$ to $a_5$ are determined in this process and known beforehand, the depth $d_0$ can be determined from the above relationship. If the angle $\theta$ is set at 45 degrees, the calculation for the depth $d_0$ can be simplified due to $\tan\theta = 1$. Although some uncertainly remain in the above relationship due to the inequity, it is sufficient for a product test which needs not obtain an accurate value for trench depth and simply requires judgment whether or not the trench depth resides within an allowable range.

Figure 5:
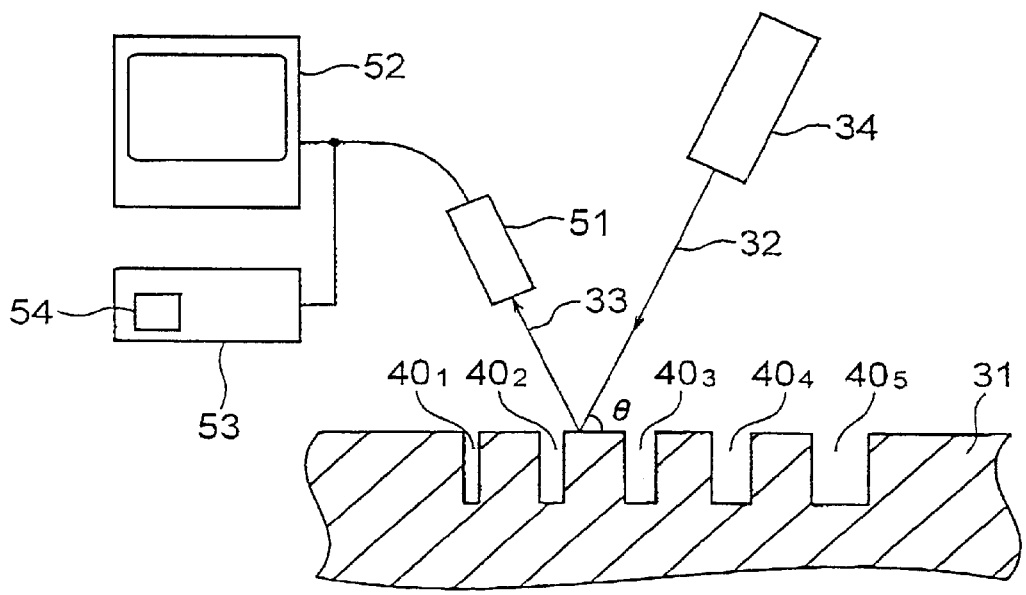
FIG. 5 is a schematic side view of the apparatus using the embodiment.

Referring to FIG. 5, a measurement apparatus according to a second embodiment of the present invention is used for a product test and includes a light source 34, a CCD camera 51, a monitor TV 52, and a processing unit 53 including a storage device 54. The reflected ray 33 is detected by the CCD camera 51, which delivers the electric signal corresponding to the images of the trenches to the monitor TV 52 and the processing unit 53. The processing unit 53 judges the depth of the measurement trenches based on the images thereof and outputs the results to a printer not shown or the monitor TV 52.

Figure 6:
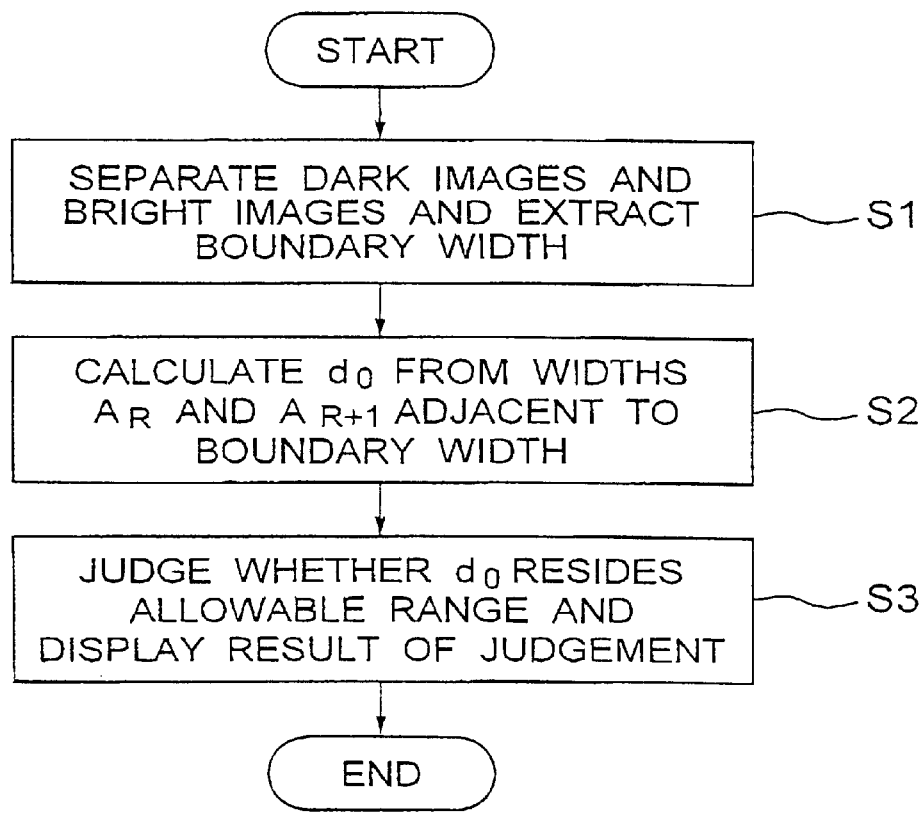
FIG. 6 is a flowchart of the operation by the apparatus using the embodiment.

The processing unit 53 operates for processing based on the flowchart shown in FIG. 6. In step S1, the processing unit 53 judges whether each of the images detected is a bright image or a dark image, detects the boundary width between the widths of the first group of trenches providing dark images and the widths of second group of trenches providing bright, and extracts the trench (it trench) having a largest width $a_k$($a_3$ in FIG. 3) in the first group and the trench (second trench) having a smallest width $a_{k+1}$($a_4$ in FIG. 3) in the second group.

In the subsequent step S2, the processing unit 53 calculates the trench depth $d_0$ from the width $a_k$ of the first trench and width $a_{k+1}$ of the second trench based on the following relationship:

$$(a_k/2)\tan\theta < d_0 \leq (a_{k+1}/2)\tan\theta.$$

In the subsequent step S3, the processing it judges whether or not the calculated depth $d_0$ resides within the specified allowable age, and outputs the result of the judgement as well as the calculated depth $d_0$ to the printer or the monitor TV.

Referring to FIG. 7, there is shown another flowchart according to another embodiment of the present invention. The block diagram of the apparatus of the present embodiment is similar to that shown in FIG. 5. In the present embodiment, a plurality of reference patterns each for a corresponding one of the depths $d_h$ are stored beforehand in as age device 54 in he processing unit 53. For measurement, while irradiating the measurement trenches with a parallel ray, the process unit 53 detects the images pattern for the trenches and then determines a boundary width (steps S1). Subsequently, the processing unit 53 compares the obtained image pattern against each of the reference image patterns, selects one of the reference image patterns which provides a boundary widths to the boundary width in the obtained image pattern, and determines the depth of the trenches providing the selected reference image pattern as the depth $d_0$ of the subject trench (step S2). The resultant depth is output to a printer or the monitor TV (step S3)

Figure 8A:
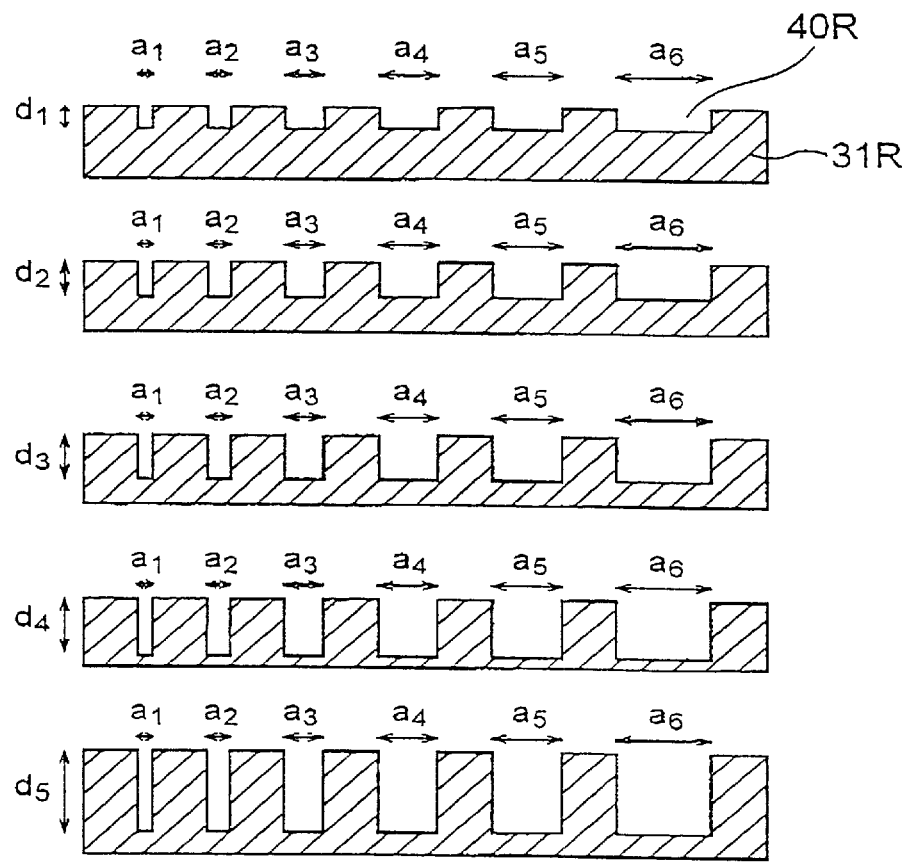
FIG. 8A shows sectional views of a plurality of reference trenches having different widths and depths.

FIG. 8A shows the reference trenches used in the present embodiment. In FIG. 8A, there is shown a specified number (N) of reference trenches 40R having different widths $a_i$ ($a_1$ to $a_N$, N=6 in this example, and $\Delta a_i = a_{i+1} - a_i$ = constant) for each of the reference trench groups having different reference depths $d_h$ ($d_1$ to $d_M$ M=5 in this example, and M≠N or M=N). These reference trenches 40R are formed on a reference substrate 31R, which is irradiated by laser to obtain reference image patterns 43 shown in FIG. 8B. Each of the reference image patterns 43 corresponds to one of the depths $d_h$. These images reference patterns 43 are stored beforehand in the storage device 54, as described above For measuring the depth of the subject trench, measurement trenches having different widths $a_1$ to $a_N$, or $a_1$ to $a_{N'}$ (N1<N), and a depth equal to the depth $d_0$ of the subject trench are formed during formation of the subject trench. The arrangement of the measurement trenches follows at least a part of the arrangement of the reference trenches 40R. That is e measurement trenches are arranged in an ascending order for the width, similarly to the reference trenches 40R.

While irradiating the measurement trenches with laser, images in the reflected ray are observed and the image pattern of the measurement trenches is obtained. The observed image pattern is compared against each of the reference image patterns 43. One of the reference image patterns having a boundary width corresponding to the boundary width of the obtained image pattern is selected for determining the depth $d_0$ of the subject trench.

Figure 8B:
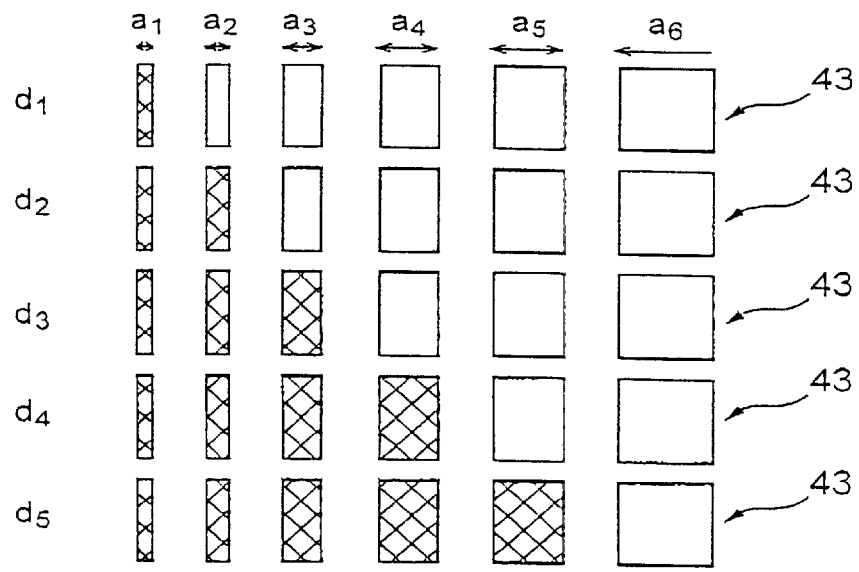
FIG. 8B shows the corresponding reference image patterns obtained from the trenches of FIG. 7A.

Assuming that the obtained image pattern is that shown in FIG. 3, the boundary width resides between the width $a_3$ and $a_4$. Thus, the reference image pattern or the depth $d_3$ in FIG. 8B is selected which has a boundary width between $a_3$ and $a_4$. Accordingly, it is judged that the depth of the subject trench is $d_3$.

The reference image patterns may be generated before each of the measurements for subject trenches. In this case the flowchart shown in FIG. 7 includes this step at the start of the measurement. In addition, the trench width $a_i$ may be input at the start of the process. It is not necessary that the widths of the measurement trenches exactly match with the widths of the reference trenches, provided that the difference of the widths between the measurement trenches and the reference trenches resides within an allowable range.

Since the above embodiments are described only for examples, the present invention is not limited to the above embodiments and various modifications or alterations can be easily made therefrom by those skilled in the art without departing from the scope of the present invention.

What is claimed is:

1. A method for measuring a depth of a subject trench comprising the steps of forming, on a substrate, a plurality of measurement trenches having different widths $a_i$ ($a_i < a_{i+1}$, i=1, 2, ..., n) and a depth equal to the depth $d_0$ of the subject trench, irradiating the measurement trenches with a parallel ray at an incidence angle of $\theta$ with respect to the surface of the substrate while detecting the reflect ray from the substrate, separating the measurement trenches into a first group providing dark images and a second group providing bright images, and calculating a range for the depth $d_0$ by using a largest width $a_k$ of the measurement trenches in the first group and a smallest width $a_{k+1}$ of the measurement trenches in the second group based on the following relationship:

$$(a_k/2)\tan\theta < d_0 \leq (a_{k+1}/2)\tan\theta.$$

2. The method as defined in claim 1, wherein the incidence angle $\theta$ is 45 degrees.

3. The method as defined in claim 1, wherein $\{(a_{i+1}-a_i)/4\}\tan\theta$ is below an allowable error for the depth of the subject trench.

4. A method for measuring a depth of a subject trench comprising the steps of preparing a plurality (M) of reference image patterns each formed from a plurality (N) of reference trenches having different widths of $a_j$ ($a_j < a_{j+1}$, j=1, 2, ... N) and a common depth selected from M different depths of $d_h$ ($d_h < d_{h+1}$, h=1, 2, ... M) by using a parallel ray irradiated at an incidence angle of $\theta$ with respect to the surface of a reference substrate having the reference trenches, forming, on a measurement substrate, a plurality of measurement trenches having different width $a_i$ ($a_i < a_{i+1}$, i=1, 2, ... n) and a depth equal to the depth $d_0$ of the subject trench, irradiating a parallel ray at an incidence angle of $\theta$ with respect to the surface of the measurement substrate while detecting the reflected ray from the measurement substrate, detect a boundary width between the widths of a first group of the measurement trenches providing dark images and the widths of a second group of the measurement trenches providing bright images, and selecting, for the depth $d_0$, the depth of the plurality of reference trenches which provide one of the reference image patterns having a boundary width corresponding to the boundary width detected from the measurement trenches.

5. The method as defined in claim 4, wherein the incidence angle $\theta$ is 45 degrees.

6. The method as defined in claim 4, wherein $\{(a_{i+1}-a_i)/4)\}\tan\theta$ is below an allowable error for the depth of the subject trench.

7. An apparatus for measuring a depth of a subject trench comprising a light source for irradiating light to a substrate having a plurality of measurement trenches at an incidence angle of $\theta$ with respect to a substrate surface, said measurement trenches having a plurality of widths and a depth equal to the depth of the subject trench, a CCD camera for detecting the images of the measurement trenches in the reflected light from the substrate to output an image signal, and a processing unit for calculating the depth $d_0$ of the subject trench based on the image signal from the CCD camera, by separating the measurement trenches into a first group providing dark images and a second group providing bright images, and calculating a range for the depth $d_0$ by using a largest width $a_k$ of the measurement trenches in the first group and a smallest width $a_{k+1}$ of the measurement trenches in the second group based on the following relationship:

$(a_k/2)\tan \theta < d_0 \leq (a_{k+1}/2)\tan \theta.$

8. An apparatus for measuring a depth of a subject trench comprising a storage device for storing a plurality of reference image patterns each formed from a plurality (M) of reference trenches having different widths of $a_j$ ($a_j<a_{j+1}$, j=1, 2, ... N) and a common depth selected from M different depths of $d_h$ ($d_h<d_{h+1}$, h=1, 2, ... M), a light source for irradiating light to a substrate having a plurality of measurement trenches at an incidence angle of $\theta$ with respect to the substrate surface, the measurement trenches having a plurality of widths and a depth equal to the depth of the subject trench, a CCD camera for detecting the images of the measurement trenches in the reflected light from the substrate to output an image signal, and a processing unit for calculating the depth $d_0$ of the subject trench based on the image signal from the CCD camera by detecting a boundary width between the widths of a first group of measurement trenches providing dark images and the widths of a second group of measurement trenches providing bright images, and selecting, for the depth $d_0$, the depth of the plurality of reference trenches which provide one of the reference image patterns having a boundary width corresponding to the boundary width detected from the measurement trenches.

* * * * *